United States Patent
De Lamberterie et al.

(10) Patent No.: US 11,181,364 B2
(45) Date of Patent: Nov. 23, 2021

(54) OBJECT DETECTION SYSTEM AND METHOD FOR A MOTOR VEHICLE

(71) Applicant: VALEO VISION, Bobigny (FR)

(72) Inventors: Antoine De Lamberterie, Bobigny (FR); Samira Mbata, Bobigny (FR); Thomas Canonne, Bobigny (FR); Guillaume Thin, Bobigny (FR); Olivier-Sebastien Lesaffre, Bobigny (FR)

(73) Assignee: VALEO VISION, Bobigny (FR)

( * ) Notice: Subject to any disclaimer, the term of this patent is extended or adjusted under 35 U.S.C. 154(b) by 499 days.

(21) Appl. No.: 16/037,562

(22) Filed: Jul. 17, 2018

(65) Prior Publication Data
US 2019/0017820 A1   Jan. 17, 2019

(30) Foreign Application Priority Data

Jul. 17, 2017 (FR) ...................... 17 56736

(51) Int. Cl.
| | | |
|---|---|---|
| G01C 3/10 | (2006.01) | |
| G01C 3/08 | (2006.01) | |
| B60Q 1/00 | (2006.01) | |
| G01S 17/48 | (2006.01) | |
| H01L 27/15 | (2006.01) | |
| G01S 17/931 | (2020.01) | |
| H01L 25/16 | (2006.01) | |

(52) U.S. Cl.
CPC ............. *G01C 3/10* (2013.01); *B60Q 1/0023* (2013.01); *G01C 3/08* (2013.01); *G01S 17/48* (2013.01);
(Continued)

(58) Field of Classification Search
CPC ...... G01S 13/931; G01S 17/931; G01S 7/023; G01S 2013/93271; G01S 2013/9316;
(Continued)

(56) References Cited

U.S. PATENT DOCUMENTS

| 2005/0180149 A1 | 8/2005 | Albou et al. |
| 2008/0046150 A1 | 2/2008 | Breed |

(Continued)

FOREIGN PATENT DOCUMENTS

| DE | 10 2005 041 466 A1 | 3/2007 | |
| DE | 102005041466 | * 8/2007 | ............. G01B 11/24 |
| EP | 1 553 429 A1 | 7/2005 | |

OTHER PUBLICATIONS

Translation for DE102005041466 (Year: 2007).*
(Continued)

*Primary Examiner* — Luke D Ratcliffe
(74) *Attorney, Agent, or Firm* — Oblon, McClelland, Maier & Neustadt, L.L.P.

(57) ABSTRACT

An object detection system for a motor vehicle is proposed. The system includes an array of electroluminescent light sources, an array of light sensors and a calculating unit. At least one of the electroluminescent light sources is able to emit a signal. At least one of the sensors is able to receive the emitted signal that has been reflected by an object. The calculating unit is able to calculate, by triangulation, the position of the object on the basis of the position, in one of the arrays of electroluminescent light sources, of at least one of the electroluminescent light sources able to emit a signal and on the basis of the position, in one of the arrays of light sensors, of at least one of the sensors able to receive the signal reflected by the object.

17 Claims, 6 Drawing Sheets

(52) U.S. Cl.
CPC .......... *G01S 17/931* (2020.01); *H01L 27/156* (2013.01); *H01L 25/167* (2013.01)

(58) Field of Classification Search
CPC ... G01S 2013/93272; G01S 2013/9315; B60K 35/00; B60R 21/0134; B60R 2021/0004; B60R 2021/0018; G01C 3/10; G01C 3/08
See application file for complete search history.

(56) References Cited

U.S. PATENT DOCUMENTS

| | | |
|---|---|---|
| 2008/0119993 A1* | 5/2008 | Breed ..................... G01S 7/023 701/46 |
| 2009/0097038 A1* | 4/2009 | Higgins-Luthman ....................... B60G 17/019 356/602 |
| 2009/0225330 A1 | 9/2009 | Chow |
| 2010/0057305 A1 | 3/2010 | Breed |
| 2012/0050694 A1 | 3/2012 | Huang et al. |
| 2013/0250112 A1 | 9/2013 | Breed |
| 2014/0063255 A1 | 3/2014 | Breed |
| 2014/0098556 A1 | 4/2014 | Von Malm et al. |
| 2020/0141722 A1* | 5/2020 | Korner ............... G01B 11/2522 |

OTHER PUBLICATIONS

French Preliminary Search Report dated Apr. 5, 2018 in French Application 17 56736 filed on Jul. 17, 2017 (with English Translation of Categories of Cited Documents).

* cited by examiner

OBJECT DETECTION SYSTEM AND METHOD FOR A MOTOR VEHICLE

FIELD OF THE INVENTION

The present invention relates to the field of object detection systems and methods for motor vehicles.

BACKGROUND

Viewing the environment surrounding a motor vehicle is essential, in particular in the context of self-driving cars. It requires detecting and evaluating the distance from objects that are present on or near the road.

The detection of objects that are present in the environment of a self-driving vehicle is nowadays mainly performed by lidars (acronym for light detection and ranging), or else by radars. These two systems make it possible to calculate the distance from an object situated near the vehicle. These systems send a wave, for example a laser beam or even a microwave beam, to an object that reflects said beam: the distance from the object is then deduced from the time that has elapsed between the moment when the wave was emitted and the moment when the wave reflected by the object was received.

Radars and lidars, although they are widespread in the motor vehicle field, have numerous drawbacks. First of all, they require the addition of on-board hardware that burdens the vehicle. In general, this burdensome hardware is situated on the roof of the vehicle, thereby possibly causing problems with aerodynamics along with aesthetic problems. In addition, the accuracy of the distances measured by a lidar is independent of the distance at which the object is situated. Specifically, lidars operate by sending a very short burst of light: the accuracy of a distance measured by a lidar depends on the duration of this burst of light, regardless of the distance from the object. An error or a variation of a few nanoseconds may result in an evaluation error in the distance of the order of a metre, which is unacceptable in the context of motor vehicle safety.

In this context, there is therefore a need to improve the evaluation of the distance between a motor vehicle and an object present in its environment. It is important in particular to develop a solution that improves the accuracy of the estimation of the distance as the object moves closer to the vehicle, and that does not require the addition of additional hardware that burdens the vehicle.

SUMMARY OF THE INVENTION

To this end, an object detection system for a motor vehicle is proposed. The system comprises one or more arrays of electroluminescent light sources, one or more arrays of light sensors, a calculating unit, and in which system at least one of the electroluminescent light sources is able to emit a signal, at least one of the sensors is able to receive the emitted signal that has been reflected by an object, the calculating unit is able to calculate, by triangulation, the position of the object on the basis of the position, in one of the arrays of electroluminescent light sources, of said at least one of the electroluminescent light sources able to emit a signal and of the position, in one of the arrays of light sensors, of said at least one of the sensors able to receive the signal reflected by the object.

Furthermore, the system may furthermore comprise:
said at least one of the electroluminescent light sources is able to emit the signal in a direction contained in an emission cone, said at least one of the sensors is able to receive the signal reflected by the object in a direction contained in a reception cone, and the calculating unit is able to calculate, by triangulation, the position of the object furthermore on the basis of a solid angle of the emission cone and of a solid angle of the reception cone;
an intersection of the emission cone and of the reception cone defines a volume in which the object that reflected the emitted signal is situated;
said at least one of the electroluminescent light sources is furthermore able to mark the emitted signal through coding of the emitted signal;
said one or more arrays are monolithic arrays of light-emitting diodes;
said one or more arrays of light sensors are selected from among an array of electroluminescent light sources having electroluminescent light sources used as light sensors; an array of photographic sensors; a monolithic array of light-emitting diodes used as light sensors;
the solid angle of the emission cone is greater than the solid angle of the reception cone;
said one or more arrays of light sensors are positioned in a camera;
at least one of said one or more arrays of light sources is contained in a first motor vehicle headlight;
the camera is contained in the first headlight or in a second headlight.

An object detection method for a motor vehicle that comprises or integrates the system according to the invention is also proposed. The method comprises the steps of emitting, by way of at least one of the electroluminescent light sources, a signal; receiving, by way of at least one of the sensors, the emitted signal that has been reflected by an object; calculating, by way of the calculating unit, the position of the object on the basis of the position, in one of the arrays of light sources, of said at least one of the electroluminescent light sources that emitted the signal and of the position, in one of the arrays of light sensors, of said at least one of the sensors that received the signal reflected by the object.

The method may furthermore comprise:
the signal reflected by the object is received by a plurality of light sensors, and furthermore comprising, after the reception step, the step of determining the sensor that received the greatest intensity of the signal from among said plurality of light sensors that received the light reflected by the object; and wherein the calculating step is performed with the position, in one of the arrays of light sensors, of a sensor that has been identified as having received the greatest intensity of the signal reflected by the object;
forming at least two sets of electroluminescent light sources, a set comprising at least one from among: the electroluminescent light sources of one or more rows of said one or more arrays of electroluminescent light sources; the electroluminescent light sources of one or more columns of said one or more arrays of electroluminescent light sources; at least one of the electroluminescent sources that is adjacent to at least one of the electroluminescent light sources that previously emitted the received signal; selecting one of the sets of electroluminescent light sources; and wherein the emission step is performed by the electroluminescent light source(s) of the selected set;
after a first iteration of the method, the step of identifying said at least one of the electroluminescent light sources that emitted the received signal; and wherein said one of the selected sets of electroluminescent light sources comprises at least one of the electroluminescent sources adjacent to said at least one of the identified electroluminescent light sources;

a period of repetition of the steps of the method is less than or equal to 10 ms.

A computer program including program code instructions for executing the steps of the method according to the invention when said program is executed on a processing unit is also proposed. The processing unit may be a calculating unit of the system.

A medium able to be read or accessed by a processing unit and on which the computer program is stored is also proposed. The medium may be a memory. The memory may be integrated into the system according to the invention.

Such a detection system and method improve the detection of an object positioned on a motor vehicle. They fall within pixelated light beam projection technologies. Such a light beam makes it possible, by virtue of its pixelated nature, to project one or more signals in a well-defined direction. The accuracy of the detection is therefore increased in comparison with known systems and methods. The accuracy does not hinge on the properties of the signal that is sent, such as for example the duration of a burst of light, but on the geometrical properties of the system and a calculation by triangulation. Furthermore, the system according to the invention is easily able to be integrated into a motor vehicle without an additional burden. In particular, the arrays of electroluminescent light sources and of light sensors may be integrated into the headlights of a motor vehicle due to their small dimensions. Moreover, an array of light sources may also serve as a sensor, thereby limiting the number of components that are used in the detection system according to the invention. Furthermore, the detection system is easily able to be integrated with equipment that is already present in a vehicle: for example a camera supplying an on-board computer with information regarding the environment of the vehicle may be used as a sensor for the detection system.

BRIEF DESCRIPTION OF THE FIGURES

Various examples of the invention, which are in no way limiting, will now be described with reference to the appended drawings, in which.

DETAILED DESCRIPTION

Figure 4:
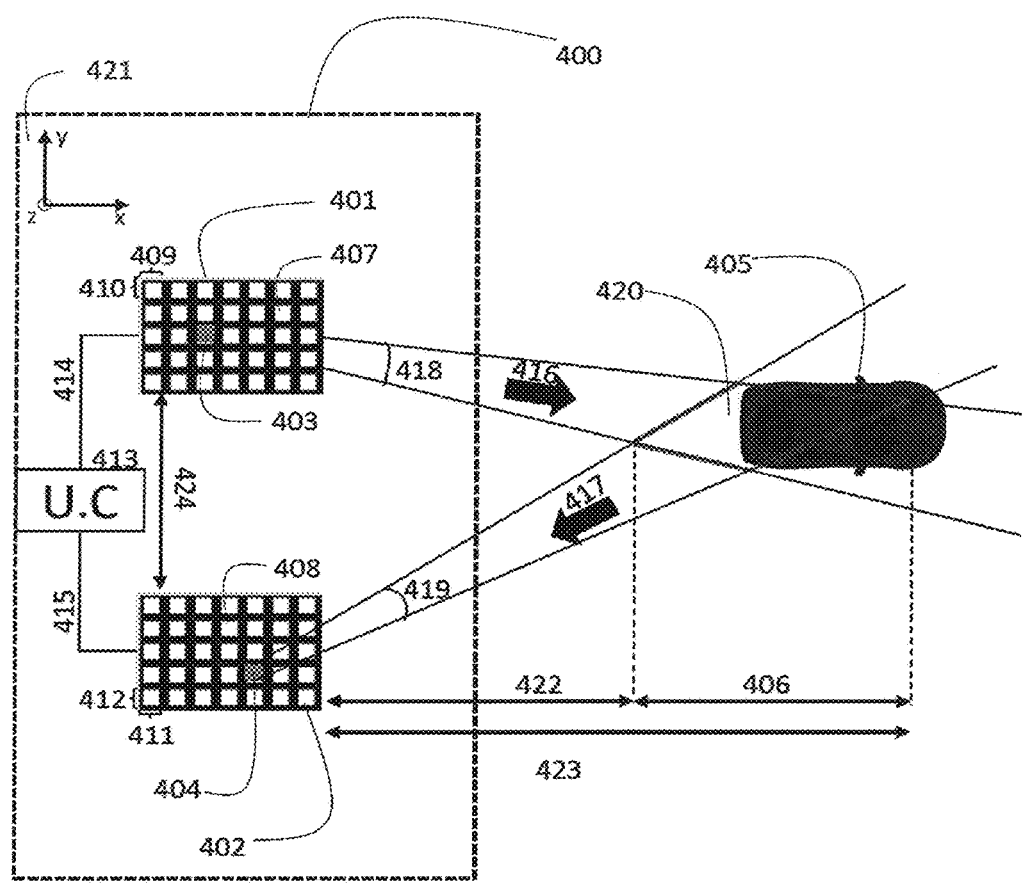
FIG. 4 illustrates an example of an object detection system according to the invention in which a signal is emitted by one of the electroluminescent light sources of an array.

FIG. 4 illustrates an example of an object (405) detection system (400) according to the invention. This object detection system may be contained in a motor vehicle. For example, the detection system according to the invention may be integrated fully or partly into the lighting devices of the vehicle, in particular into the headlamps of the vehicle. Examples of integration of the object detection system according to the invention are described further on.

An object detection system 400 for a motor vehicle is a system that makes it possible to automatically ascertain the presence of one or more objects in the environment in which the vehicle is travelling. Automatically means that the user is not involved in the detection. The object detection system, when it is integrated into a vehicle, preferably makes it possible to detect objects that are situated on the path of the motor vehicle, and more generally objects that are situated in the scene of the vehicle. The scene of the vehicle may be a space surrounding the vehicle, for example in a radius of 360° around the vehicle. One particular scene is the 'road scene', which is the environment of the vehicle capable of being illuminated by a headlight of the vehicle. The detection system integrated into the vehicle makes it possible to calculate the position of these objects with respect to the motor vehicle. As a result, the system makes it possible to evaluate the distance, the speed and the path of the detected objects with respect to the motor vehicle.

The object detection system 400 comprises one or more arrays 401 of electroluminescent light sources 407. The expression 'array of electroluminescent light sources' makes reference to a network of a plurality of electroluminescent light sources that are positioned in a pattern that may be regular. This pattern, as is able to be seen in FIG. 4, may be a grid of electroluminescent light sources; the grid is formed of rows 409 of electroluminescent light sources and of columns 410 of electroluminescent light sources. In this context, the electroluminescent light sources may also be called pixels of the array; reference is then made to a grid of pixels.

An array comprises one or more electroluminescent light sources. An electroluminescent light source may be, but is not limited to, a light-emitting diode (LED in acronym form), an organic light-emitting diode (OLED in acronym form), or a polymer light-emitting diode (PLED in acronym form). More generally, an electroluminescent light source is any material that emits light in response to an electric current flowing through it or to a strong electrical field.

An array of electroluminescent light sources may furthermore be a monolithic array, then called a monolithic source: this means that the electroluminescent elements are situated on one and the same substrate, and preferably on one and the same face of the substrate, which may for example be sapphire or else silicon. The electroluminescent light sources are deposited on or extend from at least one face of the substrate. These electroluminescent light sources may for example be LEDs. When the array of electroluminescent light sources is monolithic, the array may be high-density, that is to say that it comprises a very large number of electroluminescent elements, at least several hundred electroluminescent elements. In practice, the source includes more than 500 electroluminescent light sources on the same substrate. The pixel density is preferably higher than 500 pixels per $cm^2$. It is typically between 500 and 2500 pixels per cm². It is understood that the pixel density of a light source with a high density of electroluminescent light sources may be higher than 2500 pixels per cm².

Each of the electroluminescent light sources of the array may be electrically independent of the others, that is to say emit, or not emit, light independently of the state (turned on, turned off, faulty) of the other electroluminescent light sources of the array. In this case, each electroluminescent light source of the array is controlled individually by an electronic circuit, called a driver or a microcontroller. The driver manages the supply of electric power to the array, which may or may not be monolithic, which is the same as saying that it individually manages the supply of electric power to each electroluminescent light source of the array. As an alternative, electroluminescent light sources may be grouped together electrically, for example by supplying them with electric power using a parallel or series connection, so as to reduce the number of elements to be managed. The sets may for example comprise between two and four electroluminescent light sources, this number making it possible to keep a sufficiently pixelated light beam. The driver is therefore an electronic device that is able to control the elements of an array of electroluminescent light sources. A plurality of drivers may be used to drive the elements of the array.

Figure 1:
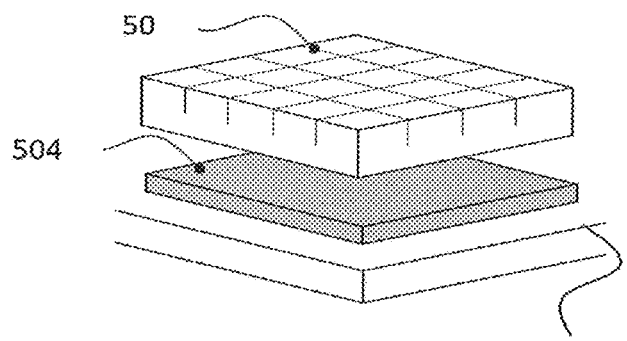
FIG. 1 illustrates a first example of arrays of light sources able to be used in the context of the invention.
Figure 2:
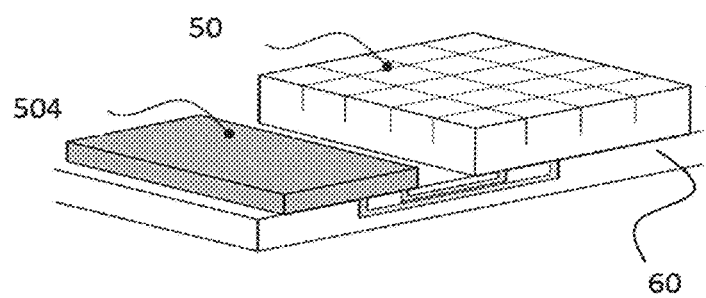
FIG. 2 illustrates a second example of arrays of light sources able to be used in the context of the invention.
Figure 3:
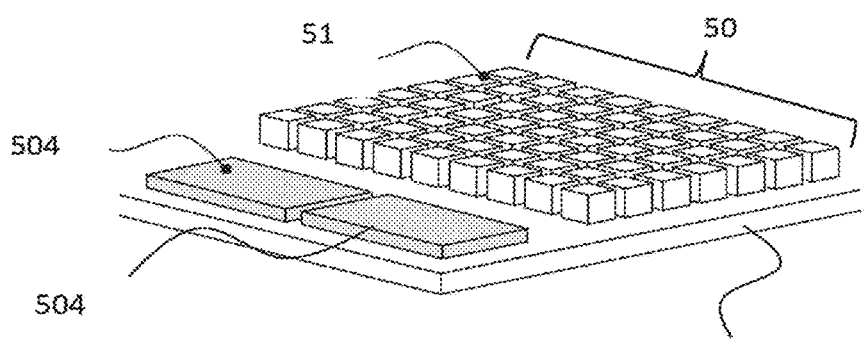
FIG. 3 illustrates a third example of arrays of light sources able to be used in the context of the invention.

Examples of arrays of electroluminescent light sources are shown in FIGS. 1 to 3.

FIG. 1 illustrates an array of electroluminescent light sources 50, which is a monolithic source in this example. A driver 504, which makes it possible to control the electroluminescent light sources of the array of electroluminescent light sources, is positioned between the array of electroluminescent light sources 50 and a carrier 60.

FIG. 2 illustrates the same elements as those of FIG. 1, but arranged differently. A monolithic array of electroluminescent light sources 50 and a driver 504 are positioned on a carrier 60. The driver 504 controls the supply of power to the elements of the array. The example of FIG. 1 offers a better space saving than that of FIG. 2. However, the example of FIG. 2 allows better cooling of the driver 504 than the example of FIG. 1.

FIG. 3 illustrates an example similar to that of FIG. 2, but in which the array of electroluminescent light sources is not monolithic. The electroluminescent light sources 51 of the array 50 are positioned on a carrier 60 and form a grid, as discussed with reference to FIG. 4. In this example, two drivers 504 control the electroluminescent light sources 51 of the array 50. It is also possible, in another embodiment, for each of the electroluminescent light sources to be controlled by a driver.

The detection system also comprises one or more arrays 402 of light sensors 408. The expression 'arrays of light sensors' makes reference to a network of a plurality of light sensors that are positioned in a pattern that may be regular. An example of a regular pattern is shown in FIG. 4. In this example, the pattern is a grid formed of rows 412 of light sensors 402 and of columns 411 of light sensors 402; the expression grid of sensors may also be used.

A light sensor is a device that makes it possible to convert electromagnetic radiation into an electrical signal, which may be a variation in electric current or voltage. The electromagnetic radiation may be visible light (for example white light), or non-visible light, for example UV (ultraviolet) or IR (infrared). These light sensors are also called photodetectors.

Some electroluminescent light sources may be used as light sensors, such as a light-emitting diode LED or a photodiode. Photons emitted by a light source are captured at one or more LEDs of an array of light sensors, and the LEDs that capture the photons generate an electric current. The physical properties of the diodes, that is to say their p-n junction, are therefore used to detect light, and not (just) to emit light. Thus, the array of light sensors may be an array of electroluminescent light sources, as illustrated in the examples of FIGS. 1 to 5.

The electroluminescent light sources of an array of electroluminescent light sources may therefore be used as light sensors. It may be contemplated, in one example, for the electroluminescent light sources to be used alternately as light sources and as sensors. In the example of FIG. 4, the array of electroluminescent light sources 401 and the array of light sensors 402 are spaced apart by a distance 424. This distance 424 prevents or limits interference that could be created by the signal emitted by an electroluminescent light source of the array 401 at the sensors of the array 402.

In one example, a camera, which comprises one or more arrays of light sensors, usually photodiodes, may also be used as a sensor. An example of a camera is presented in the discussion of FIG. 8.

The object detection system also comprises a calculating unit (UC) 413. The calculating unit makes it possible to calculate the distance between the object detection system and the detected object. When the detection system is integrated into a vehicle, for example on the front of the vehicle, the calculating unit then makes it possible to calculate the distance between the detected object and the vehicle. The calculating unit may be linked to a memory so as to store the calculated distances therein. The calculating unit may be for example an arithmetic logic unit (ALU). The calculating unit may receive data from the array of light sources and the array of light sensors, via the connections 414 and 415 for example. These connections, via which data buses transit, may be wired or wireless. It is preferred to use wired connections, as this ensures a faster and more reliable transfer of data.

The detection system integrated into a vehicle makes it possible to detect an object positioned in the environment of the vehicle and to determine the distance between the object 405 and the vehicle. The distance is determined using the principle of triangulation. As illustrated in FIG. 4, the emitted signal, the direction of propagation of which is depicted by the arrow 416, is reflected by the object 405, which in this example is another vehicle situated in front of the vehicle integrating the system 400 according to the invention. The reflected signal, the direction of propagation of which is depicted by the arrow 417, is received by one of the sensors of the array of light sensors. The distance from the object is then calculated by triangulation on the basis of the position of the electroluminescent light source emitting the signal in the array of electroluminescent light sources and of the position of the light sensor receiving the signal in the array of light sensors. Thus, the calculation of the distance between the object and the vehicle depends on the execution of the following three steps.

First of all, a signal is emitted by at least one of the electroluminescent light sources of the array of electroluminescent light sources. This signal is typically a light signal.

Next, the signal is reflected by an object present in the environment of the vehicle, for example the vehicle 405 of FIG. 4. The arrays of light sources and the arrays of light sensors are preferably positioned in such a way as to cover the road scene; for example, they are situated on the front face of the vehicle integrating the system 400.

Lastly, the distance is calculated following the reception of the reflected signal by one of the light sensors of the array of light sensors. Without detecting the reflected signal, the object is not detected, and its distance is not able to be evaluated. It is necessary for at least one of the elements of the array of sensors to be able to receive the reflected signal.

The signal emitted by at least one of the electroluminescent elements of the array of electroluminescent sources propagates in a direction that is contained in an emission volume that delimits the physical zone of the environment (and therefore of the scene) in which the emitted signal propagates. The emission volume is an emission cone, which may be for example a circular cone, or a pyramidal cone if the electroluminescent light source has a quadrilateral shape. The region of the space limited by the emission cone, which is not necessarily circular, is a solid angle, referenced 418 in FIG. 4. The electroluminescent light sources of the array of electroluminescent light sources are generally identical: in this case, these electroluminescent light sources have emission cones with similar geometrical properties, that is to say identical solid angles. In any case, each electroluminescent light source may be defined as being a point source with which there is associated an emission volume in which the electroluminescent light source radiates, all of these emission volumes defining the volume of the space of the scene illuminated by the array.

A signal reflected by an object is received by at least one light sensor of the array of light sensors. The received reflected signal is characterized in that it has propagated in a reception volume (it may also be said that it propagates within a reception volume). Just like an emission volume, a reception volume is a reception cone that may be for example a circular cone or a pyramidal cone. The region of the space limited by the reception cone, which is not necessarily circular, is a solid angle, referenced 419 in FIG. 4. The reception cone delimits the physical space of the environment in which the reflected signal(s), able to be received by the light sensor associated with the reception cone, propagate(s). Thus, only the signals propagating in a reception cone are detected by the light sensor associated with this reception cone. In any case, each light sensor may be defined as being a light sensor with which there is associated a reception volume in which the signal able to be received by this light sensor propagates, all of these reception volumes defining the volume of the space in which the reflected signals have to propagate in order to be received by at least one of the light sensors of the array.

The reception of a reflected signal by at least one of the light sensors of the array of light sensors is a manifestation of the detection of an object 405. The object detection system then determines the position of the detected object with respect to the vehicle. Determining the position of the object with respect to the vehicle 400 in which the object detection system is integrated means giving the position of the object in the reference frame 421 linked to the object detection system and to the vehicle.

All or part of the detected object is located in the volume defined by the intersection of the emission cone with the reception cone: this volume is shown in two dimensions in FIG. 4 by way of a quadrilateral 420. This volume defines the zone in which the object, or at the very least part of the object (in this case the rear of the vehicle 405), is probably located. There is a certain probability of the object being situated in this volume. The volume defined by the intersection of the two cones has a maximum length 406, i.e. the greatest distance between two points belonging to the volume. The probability of the object being present varies within this zone. The distance 422 corresponds to the minimum distance at which it is probable that the object is located and the distance 423 corresponds to the maximum distance at which it is probable that the object is located. These two distances 422 and 423 are determined by triangulation, the principle of which is explained with reference to FIG. 9.

The reception cones and the emission cones may have solid angles of different dimensions. In a first example, all of the electroluminescent light sources of an array have emission cones having a first solid angle value that is identical for all of the sources of the array, and all of the sensors of an array of light sensors have reception cones having a second solid angle value that is identical for all of the sensors. The first value may be higher than the second value, or, by contrast, the second value may be higher than the first value. Reducing or increasing these first or second solid angle values may be achieved for example using known optical devices.

The emission of a signal by at least one of the electroluminescent light sources of the array of electroluminescent light sources may be driven by a driver. The emitted signal may be a light signal. This light signal propagates in a substantially rectilinear manner in a direction that is contained within the emission cone of the electroluminescent source emitting this signal.

The sent light signal may be marked by the electroluminescent light sources that emits it. For example, the marking may consist of coding of the emitted light signal. The coding may be performed by modulating the emitted light signal. Modulating a light signal is a manifestation of a process by way of which one (or a combination or two or more) of the characteristic variables of the light signal, chosen from among the amplitude, the phase or the frequency, is (or are) modified.

Marking the emitted signal, that is to say coding it, makes it possible to transmit, to the receiver, the information that the signal reflected by the object is a signal that has been emitted by one of the electroluminescent light sources of the detection system, and not a light source of the scene, such as for example that of another vehicle 406 or even a street light. Furthermore, the marking may make it possible to distinguish one signal from among a plurality of signals that are sent by one or more arrays of light sources. For each detected signal, it is therefore possible to identify the electroluminescent light source that emitted it. The marking therefore plays the role of a unique identifier for each sent signal, thereby making it possible to construct, for each detected signal, a pair that comprises the electroluminescent light source that emitted the signal and the light sensor that received the signal.

A signal may be sent by one or more pixels 407 of the array 401. When the signal is emitted by a plurality of pixels, the signal is preferably emitted simultaneously by all of the light-emitting diodes 407 sending the signal, so as to increase the accuracy of the detection system and to prevent errors from being able to occur in the determination of the position of the object. Simultaneously emit means that the two or more electroluminescent sources emit light at one and the same moment in time, this same moment being able to comprise a time interval.

Figure 9:
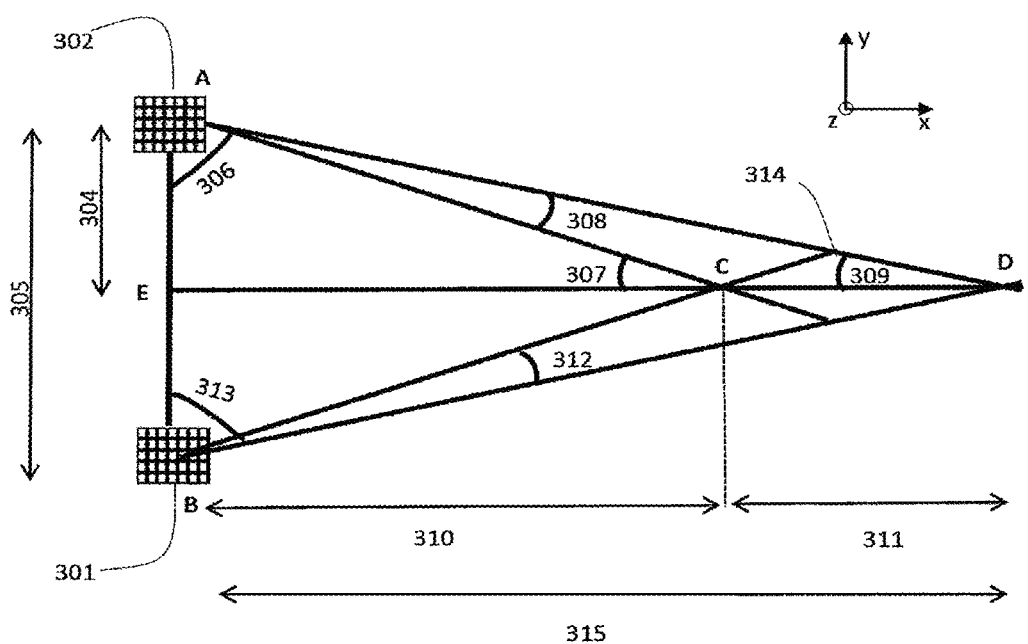
FIG. 9 illustrates the principle of triangulation in an example of an object detection system.

Determining the position of the object with respect to the vehicle may comprise determining the distances 422 and 423 indicated in FIG. 4. To this end, the principle of triangulation that is illustrated in FIG. 9 is used. FIG. 9 is a two-dimensional (2D) depiction—in the plane (x,y) of the reference frame 421 of FIG. 4—in which the abovementioned distances 422 and 423 are denoted 310 and 311. The solid angles characterizing the emission and reception cones are represented by the angles 308 and 312, respectively. Similarly, the volume in which the object is probably present is shown in two dimensions by a quadrilateral 314, which is the zone in which the object is probably present. Triangulation consists in determining the position of an apex of a triangle with knowledge of the distance separating the two other apexes and the angles of the base of the triangle, using known trigonometric formulae. For example, for the triangle ABC of FIG. 9, the following may be known: the distance 305 separating the light source from the array 302 that emitted the signal and the sensor of the array of light sensors 301 that received the signal, and the angles 306 and 313 of the base of the triangle. These data thus make it possible to determine, by triangulation, the distance 310 indicated in FIG. 9. In another example that applies this time to the triangle ABD: with knowledge of the angles 306 and 313 of the base of the triangle, the solid angles 308 and 312 of the emission and reception cones, and the distance between the light source of the array 302 that emitted the signal and the sensor of the array of light sensors 301 that received the signal, it is possible to calculate the distance 315. Triangulation makes it possible to determine the three variables that characterize the position of the detected object: the minimum distance at which it is probable that the object is located 310, the maximum distance at which it is probable that the object is located 315, and the distance 311 that represents the difference between the two of them. This distance 311 is the 'length' of the zone 314 in which the object is probably present. Length of the zone in which the object is probably present is understood to mean the difference between the minimum probable position 310 and the maximum probable position 315 of the object with respect to the vehicle.

Determining these variables depends on the positions of the emitting electroluminescent light source and of the receiving light sensor in the array of electroluminescent light sources and the array of light sensors, respectively. Specifically, the angles of the base of the triangles ABC and ABD depend on these positions. In other words, the position of an object is calculated using the position, in its array, of the electroluminescent light source that emitted the signal and using the position, in its array of sensors, of the light sensor that received the signal reflected by the object.

As outlined above, it is possible for the solid angles of the emission cone and of the reception cone to be identical or for them to have different values. With reference to FIG. 9, it is understood that the greater the solid angles of the emission and reception cones, the larger the zone in which the object is probably present. Increasing the distance separating the array(s) of light sources from the array(s) of sensors may also make it possible to reduce the length of the zone in which the object is probably present, and therefore to improve the accuracy of the calculation of the distance from the object. For example, one numerical application in the case where the resolution of the array of electroluminescent light sources is 0.1° and the object is positioned 20 m away, the length of the zone in which the object is probably present is 1.24 m for a distance of 1.2 m and is 0.73 m for a distance of 2 m between the array of electroluminescent light sources and the array of light sensors.

The length of the zone 311 in which the object is probably situated may also vary depending on the distance from the object to be detected with respect to the detection system. The closer the object to be detected, the smaller the zone in which the object is probably present, and therefore the shorter the length thereof. For example, one numerical application in the case where the resolution of the array of electroluminescent light sources is 0.1° and there is a distance of 1.2 m separating the array of electroluminescent light sources 302 and the array of sensors 301, an object 20 m away is detected with an accuracy of 1.24 m and an object 10 m away is detected with an accuracy of 0.3 m.

Figure 8:
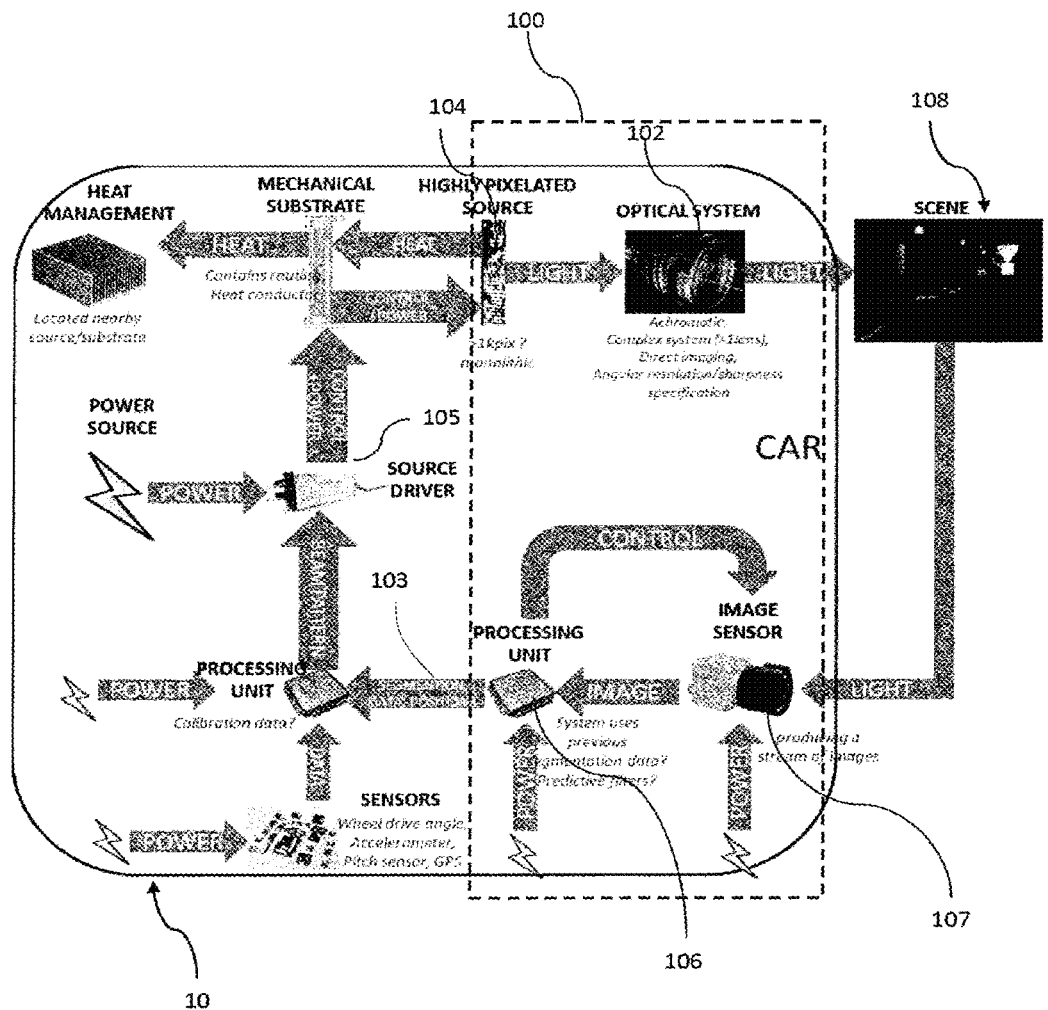
FIG. 8 illustrates an example of an object detection system according to the invention integrated into a motor vehicle.

FIG. 8 illustrates an example of integration of an object detection system 100 according to the invention into a motor vehicle, more particularly the lighting device 10 of the vehicle. The term motor vehicle covers any type of land vehicle, for example a car, a motorbike, or a lorry. The lighting device 10 may be contained in a land vehicle in order to illuminate a scene 32, for example a road. The lighting device 10 comprises at least one headlight that comprises an array of light sources 104 and an optical system 102 that makes it possible to form a light beam. The headlight may be a headlight that implements functions such as for example a 'high beam' and/or 'low beam' function. The array of light sources in the example of FIG. 8 is a monolithic pixelated source 104 of electroluminescent light sources. The monolithic pixelated source emits light, under the control of a driver 105, which is transformed into a light beam using an optical system 102. This light beam is projected onto a scene 108, or 'road scene', which is the environment of the vehicle capable of being illuminated by the lighting device of the vehicle. At least one of the electroluminescent light sources of the array 104 is able to send a light signal, coded for example by modulation of the signal. An object present in the illuminated scene may reflect the signal sent by said at least one electroluminescent element, and the reflected signal may be detected by one of the sensors of the array of light sensors of the detection system.

With continuing reference to this example, a camera 107 may be used to detect the reflection of the emitted signal. A camera is a particular device suited to detecting a light signal. A camera may comprise one or more arrays of light sensors. The array(s) of sensors of a camera may be arrays of photosensitive diodes. The detection of the signal by the camera 107 makes it possible to calculate 103, by triangulation, the distance from the object with respect to the vehicle. This calculation may be performed by a processor 106, which therefore plays the role of calculating unit. In this example, the resolution of the camera 107, that is to say the resolution of the array of light sensors, is greater than the resolution of the array of electroluminescent light sources. Thus, the solid angle of the emission cone is greater than the solid angle of the reception cone; the use of a camera with a higher resolution than an array of electroluminescent light sources makes it possible in particular to reduce the error 311 in the calculated—and presumed—distance 310 from the object. The camera may be integrated into the lighting device, that is to say into the headlamp of the vehicle. As an alternative, it may be integrated into the vehicle; for example, the camera may be the same as the one usually used to execute an anti-dazzle function.

In some examples, the array(s) of light sensors may be arrays of light sources comprising electroluminescent light sources used as light sensors or else a monolithic source of light-emitting diodes used as light sensors. Specifically, electroluminescent light sources, such as LEDs, may be used as light sensors. In these examples, the electroluminescent light sources, or light-emitting diodes, operating as sensors are then positioned in a headlight separate from the headlight where the array of electroluminescent light sources emitting the signal is positioned.

In practice, the use of a camera is preferred as the latter is able to be positioned in the same headlight as the array of electroluminescent light sources responsible for sending the signal or in a separate headlight.

The detection system according to the invention may be positioned indiscriminately at the front or at the rear of the vehicle, and indiscriminately on the left-hand side or on the right-hand side thereof. It is furthermore possible for the system to comprise two arrays of electroluminescent light sources that are used alternately as an array of electroluminescent light sources and as an array of light sensors.

The detection system according to the invention may thus be integrated indiscriminately into a left-hand front and/or right-hand front and/or left-hand rear and/or right-hand rear headlight. In a first example in which the detection system is integrated into the two front headlights of a vehicle, each headlight may be either an emitter or a receiver or else alternately an emitter and a receiver. Several configurations for integration into a motor vehicle may be contemplated. In a first configuration, the right-hand headlight comprises an array of electroluminescent light sources serving as a receiver, and the left-hand one comprises an array of electroluminescent light sources serving as an emitter, or vice versa. In a second configuration, the right-hand headlight comprises an array of electroluminescent light sources serving as an emitter, and the left-hand headlight comprises a camera serving as a detector, or vice versa. In this second configuration, the left-hand headlight may also comprise one array of electroluminescent light sources (or any other type of light source) that serves to illuminate the scene, the right-hand headlight being able to use its one array of electroluminescent light sources both to illuminate the scene and to send signals, or vice versa.

The detection system according to the invention may be integrated into a two-wheeled motor vehicle, for example a motorbike that has just one headlight. In this example, the headlight comprises at least one array of electroluminescent light sources and an array of sensors, preferably a camera.

Figure 5:
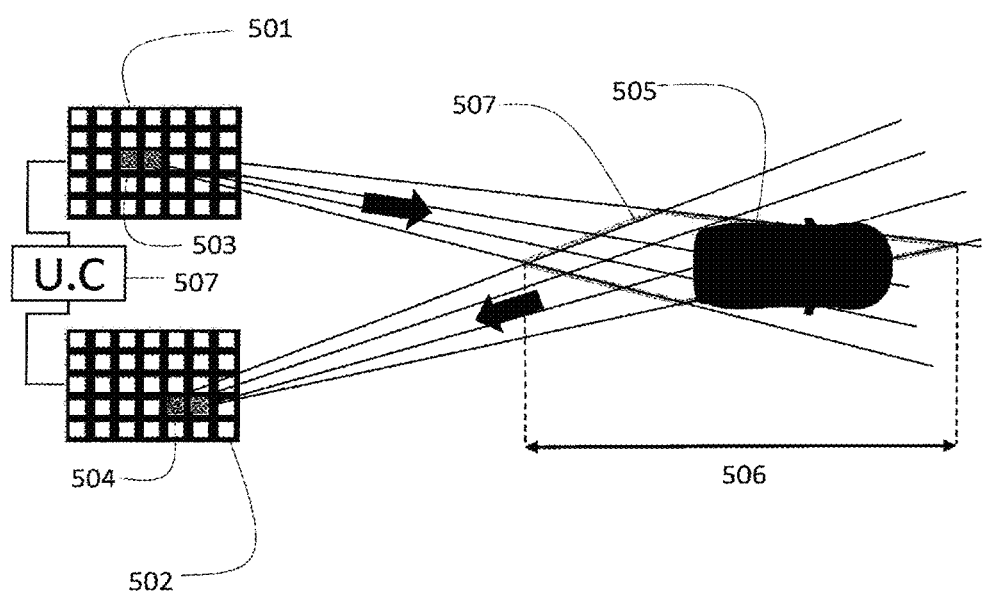
FIG. 5 illustrates an example of an object detection system according to the invention in which a signal is emitted by two electroluminescent light sources of an array.

FIG. 5 illustrates another example of an object detection system according to the invention. Just like in FIG. 4, the system includes an array of electroluminescent light sources 501, an array of light sensors 502, and a calculating unit 507 to which the two arrays are connected. An object 505 (a vehicle in this example) is situated in front of the detection system. In this example, the signal is sent simultaneously by two electroluminescent elements 503. The two sent signals are reflected by the object 505, and the reflected signals are detected by two sensors 504 of the array of light sensors. The intersection of the emission cones and of the reception cones of the emitting electroluminescent elements and of the sensors, respectively, defines a volume—shown in two dimensions in FIG. 5 by a quadrilateral 508—in which the object is probably present. The 'length' of the zone, i.e. the distance between the point of the quadrilateral closest to the vehicle and the point of the quadrilateral furthest away from the vehicle, is indicated by the double-headed arrow 506. In this example of FIG. 5, each light source sends a signal that is coded such that each signal from among those sent simultaneously are individually identifiable. It is therefore possible to construct, for each detected signal, an electroluminescent light source that emitted the signal/light sensor that received the signal pair.

The example of FIG. 5 has been shown for two electroluminescent light sources next to one another—that is to say that they have at least one shared edge—that simultaneously send a light signal. In other examples, more than two electroluminescent sources may send a signal, and said more than two electroluminescent sources may or may not be next to one another.

An example of a method for detecting objects that are present in the environment of the vehicle, using the detection system according to the invention, is now discussed. The discussion is given with reference to the flow charts of FIGS. 6 to 8.

Figure 6:
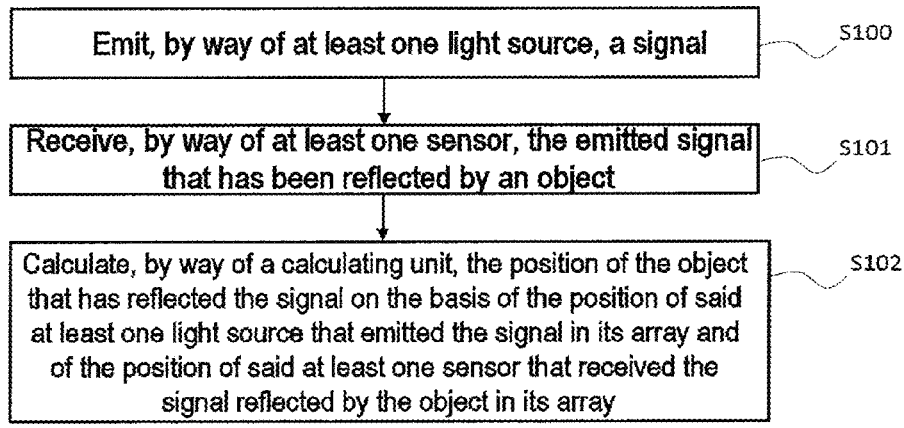
FIG. 6 illustrates a flow chart of a first example of a method for detecting an object according to the invention.

FIG. 6 illustrates an example of a method for detecting an object in which a light sensor receives the emitted signal. The method may in particular be executed by the detection system according to the invention.

In step S100, one of the electroluminescent light sources of the array of electroluminescent light sources emits a signal. Two or more electroluminescent light sources may simultaneously emit a signal. The sent light signal may also be coded such that the light sensor(s) receiving the signal may identify which light source emitted the signal.

Next, in step S101, the signal reflected by an object propagates in one of the reception cones of the light sensors of the array of light sensors, and it is received by the light sensor associated with this reception cone.

In step S102, the calculating unit calculates the position of the object, which is determined on the basis of the position of the emitting electroluminescent element in the array of light sources and the position of the sensor that received the reflected signal in the array of light sensors. These positions are transmitted to the calculating unit by the arrays in question. The distance from the object is calculated by triangulation, as explained with reference to FIG. 9.

To continuously detect the objects of the scene, step S100 is repeated continuously at a given frequency, for example of between 50 Hz and 200 Hz (hertz), bounds included, it being understood that this range may be wider. The frequency may preferably be between 100 Hz and 200 Hz. When no object(s) is (are) able to be detected or the object is not positioned in such a way as to be able to reflect the signal in the direction of the sensors of the arrays of light sensors, only step S100 may be executed and repeated. When an emitted signal is reflected, steps S101 and S102 are then executed.

Figure 7:
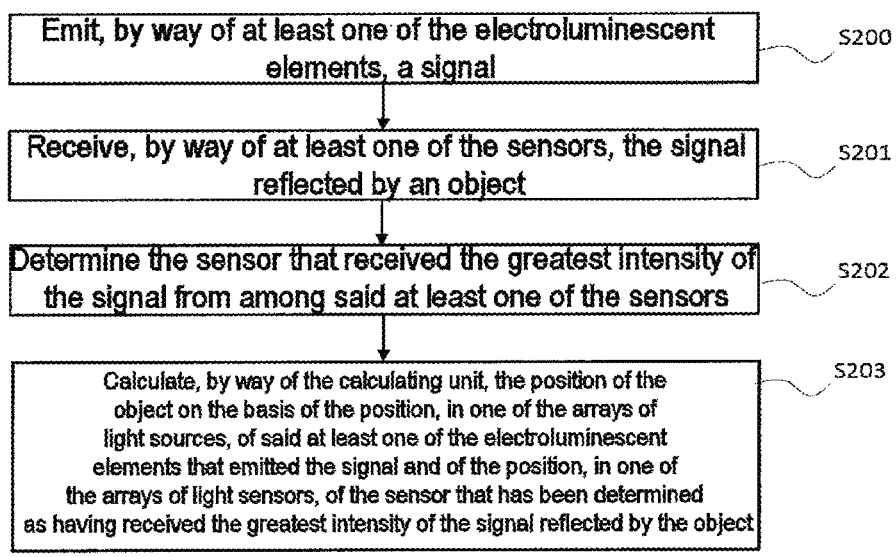
FIG. 7 illustrates a flow chart of a second example of a method for detecting an object according to the invention.

FIG. 7 illustrates another example of a method for detecting an object, in which at least two sensors receive a signal emitted by a light source.

Step S200 is similar to step S100. In the example of FIG. 7, an electroluminescent source sends a signal.

In step S201, the signal reflected by the object is received by at least two sensors of the array of light sensors. In practice, the driver or else the calculating unit determines that one and the same signal has been received by a plurality of sensors, for example a plurality of signals marked using one and the same code are received over a given period, for example lasting for a period of less than or equal to 10 ms.

In step S202, it is determined which sensor, from among the sensors that received the same reflected signal, received the greatest luminous intensity of the light signal. This determination step may be performed by the driver or else the calculating unit.

In step S203, the position of the object is calculated as explained in step S102. However, only the position of the sensor receiving the greatest luminous intensity is used to calculate the position of the object; the other sensors that received the same signal are not taken into consideration.

To continuously detect the objects of the scene, step S200 is repeated continuously at a frequency that may be identical to the one in step S100. Thus, steps S201 to S203 are executed only when an emitted signal is reflected.

The selection of one or more electroluminescent light sources that are to emit the signals is now discussed.

In a first example, the selection is made randomly. For example, the driver may comprise a pseudorandom function for selecting a light source to be turned on. In the same way, the driver may randomly select two or more light sources to be turned on simultaneously.

In a second example, the selection is made by creating sets of electroluminescent light sources. A set may for example comprise two or more electroluminescent sources that are next to one another, such as for example illustrated with reference to FIG. 5. A set may comprise one or more rows of electroluminescent light sources of an array, or else one or more columns of electroluminescent light sources. The sets are preferably formed such that each light source of an array belongs to just one set.

When a set is selected, the light sources of this set will send a signal. All of the light sources belonging to a set send a signal simultaneously. As an alternative, the light sources of a selected set send a signal sequentially.

The selection of one set of electroluminescent light sources from among two or more sets may be made randomly, or else in accordance with a predetermined sequence. Thus, if the sets that are formed comprise one or more rows of electroluminescent light sources, the selection may be made such that the next row that is selected is the one that is next to the one selected previously. In the same way, if the sets that are formed comprise one or more columns of electroluminescent light sources, the selection may be made such that the next column that is selected is the one that is next to the one selected previously.

In some examples, the selection of a set of light sources may depending on a previous detection of a signal by a sensor. From among the sets formed of light sources, the set that comprises at least one electroluminescent source that is adjacent or next to—that is to say that there is at least one shared edge or apex—the electroluminescent light source that emitted the signal detected previously, is selected. Thus, the selection of the light sources that are to send a signal is controlled on the basis of a previous detection. Advantageously, the detection system may thus refine the position and the distance from an object with respect to the detection system.

If no electroluminescent elements adjacent to the element are identified in the array of light sources, the set that is selected will be the one in which at least one of the electroluminescent sources with electroluminescent elements is closest to the identified electroluminescent light source. Typically, a Euclidean distance may be used to determine the closest light source.

The steps of the method according to the invention may be implemented in a computer program including program code instructions for executing the steps of the method. This program may then be executed on a processing unit that is able to control the object detection system presented above. For example, the processing unit may be the calculating unit of the detection system, or else an on-board computer of a motor vehicle.

The invention claimed is:

1. Object detection system for a motor vehicle, comprising:
   an array of electroluminescent light sources;
   an array of light sensors; and
   a calculating unit;
   wherein a plurality of the electroluminescent light sources is able to simultaneously emit a signal, at least one of the sensors is able to receive the emitted signal that has been reflected by an object, the calculating unit is able to calculate, by triangulation, the position of the object on the basis of the position, in the array of electroluminescent light sources, of at least one of the plurality of electroluminescent light sources able to simultaneously emit a signal and of the position, in the array of light sensors, of said at least one of the light sensors able to receive the signal reflected by the object, and
   wherein each of said a plurality of the electroluminescent light sources is configured to mark the simultaneously emitted signal with a unique coding for identifying a respective electroluminescent light source and a position of the respective electroluminescent light source within the array of electroluminescent light sources.

2. System according to claim 1, wherein said plurality of the electroluminescent light sources is able to emit the signal in a direction contained in an emission cone, said at least one of the sensors is able to receive the signal reflected by the object in a direction contained in a reception cone, and the calculating unit is able to calculate, by triangulation, the position of the object on the basis of a solid angle of the emission cone and of a solid angle of the reception cone.

3. System according to claim 2, wherein an intersection of the emission cone and of the reception cone defines a volume in which the object that reflected the emitted signal is situated.

4. System according to claim 3, wherein said array of electroluminescent light sources comprises one or more monolithic arrays of light-emitting diodes.

5. System according to claim 2, wherein said array of electroluminescent light sources comprises one or more monolithic arrays of light-emitting diodes.

6. System according to claim 1, wherein said array of electroluminescent light sources comprises one or more monolithic arrays of light-emitting diodes.

7. System according to claim 1, wherein said array of light sensors are selected from among:
   an array of electroluminescent light sources having electroluminescent light sources used as light sensors;
   an array of photographic sensors;
   a monolithic array of light-emitting diodes used as light sensors.

8. System according to claim 1, wherein said array of light sensors is positioned in a camera.

9. System according to claim 8, wherein the camera is contained in a first headlight or in a second headlight of a motor vehicle.

10. System according to claim 1, wherein the array of light sources is contained in a first motor vehicle headlight.

11. Object detection method for a motor vehicle that comprises the system according to claim 1, comprising the steps of:
   emitting, by way of the plurality of the electroluminescent light sources, a signal;
   receiving, by way of the at least one of the sensors, the emitted signal that has been reflected by an object;
   calculating, by way of the calculating unit, the position of the object on the basis of the position, in the array of light sources, of said plurality of electroluminescent light sources that simultaneously emitted the signal and of the position, in the array of light sensors, of said at least one of the sensors that received the signal reflected by the object.

12. Method according to claim 11, wherein the signal reflected by the object is received by a plurality of light sensors, and further comprising, after the reception step, the step of:

determining the sensor that received the greatest intensity of the signal from among said plurality of light sensors that received the light reflected by the object;

and wherein the calculating step is performed with the position, in the array of light sensors, of a sensor that has been identified as having received the greatest intensity of the signal reflected by the object.

13. Method according to claim 11, further comprising the steps of:

forming at least two sets of electroluminescent light sources, a set comprising at least one from among:
the electroluminescent light sources of one or more rows of said array of electroluminescent light sources;
the electroluminescent light sources of one or more columns of said array of electroluminescent light sources; and
at least one of the electroluminescent sources that is adjacent to at least one of the electroluminescent light sources that previously emitted the received signal;

selecting one of the sets of electroluminescent light sources;

and wherein the emission step is performed by the electroluminescent light source(s) of the selected set.

14. Method according to claim 13, further comprising, after a first iteration of the method, the step of:

identifying said at least one of the plurality of electroluminescent light sources that simultaneously emitted the received signal;

and wherein said one of the selected sets of electroluminescent light sources comprises at least one of the electroluminescent sources adjacent to said at least one of the identified electroluminescent light sources.

15. Method according to claim 11, wherein a period of repetition of the steps of the method is less than or equal to 10 ms.

16. Computer program including program code instructions for executing the steps of the method according to claim 11 when said program is executed on a processing unit.

17. Object detection system for a motor vehicle, comprising:

one or more arrays of electroluminescent light sources;
one or more arrays of light sensors;
a calculating unit;
wherein at least one of the electroluminescent light sources is able to emit a signal, at least one of the sensors is able to receive the emitted signal that has been reflected by an object, the calculating unit is able to calculate, by triangulation, the position of the object on the basis of the position, in one of the arrays of electroluminescent light sources, of said at least one of the electroluminescent light sources able to emit a signal and of the position, in one of the arrays of light sensors, of said at least one of the sensors able to receive the signal reflected by the object, wherein said at least one of the electroluminescent light sources is able to emit the signal in a direction contained in an emission cone, said at least one of the sensors is able to receive the signal reflected by the object in a direction contained in a reception cone, and the calculating unit is able to calculate, by triangulation, the position of the object furthermore on the basis of a solid angle of the emission cone and of a solid angle of the reception cone, and wherein the solid angle of the emission cone is greater than the solid angle of the reception cone.

\* \* \* \* \*